Aug. 5, 1969 F. M. SCHMIT 3,459,668

SEMICONDUCTOR METHOD AND APPARATUS

Filed May 21, 1965 2 Sheets-Sheet 1

INVENTOR.
FRANCIS M. SCHMIT
BY Robert O. Vidas
ATTORNEY

Aug. 5, 1969 F. M. SCHMIT 3,459,668

SEMICONDUCTOR METHOD AND APPARATUS

Filed May 21, 1965 2 Sheets-Sheet 2

*INVENTOR.*
FRANCIS M. SCHMIT
BY Robert O. Vidas
ATTORNEY

United States Patent Office 3,459,668

Patented Aug. 5, 1969

3,459,668

SEMICONDUCTOR METHOD AND APPARATUS

Francis M. Schmit, St. Louis Park, Minn., assignor to Honeywell Inc., Minneapolis, Minn., a corporation of Delaware Filed May 21, 1965, Ser. No. 457,784
Int. Cl. H01l 7/36, 7/44, 15/00
U.S. Cl. 252—62.3 2 Claims

ABSTRACT OF THE DISCLOSURE

Impurity control of doping gases for semiconductor processing by use of non-doping solvent liquid with an active doping material dissolved therein as a source of impurity for diffusion in the manufacture of semiconductor devices. A carrier gas is passed over surface of the liquid solution to entrain controlled quantities of doping impurities.

The present invention relates to a semiconductor method and apparatus, and more particularly to a method and apparatus for impurity doping of semiconductor material where close control of impurity level is achieved.

There are two types of impurity materials commonly used in preparing semiconductors; namely, P type and N type impurities. Examples of these impurities are atoms from the third and fifth groups of the periodic table respectively. Semiconductive material to which these impurity atoms have been added is known as a doped semiconductor. As used in this specification, the term doping covers both the addition of impurities to an essentially intrinsic semiconductor to form a conductivity type and the addition of impurities to an already doped semiconductor to change its conductivity or its conductivity type. One method of doping semiconductors is by diffusion of the impurity atoms from a heated atmosphere by means of a surface reaction into a heated semiconductor. The doping level may be controlled by controlling the vapor pressure of the impurity atoms in the source. Various means have been proposed for controlling the vapor pressure of the doping atoms in the source. However, none of the methods heretofore proposed have given repeatable results at low concentrations of impurity atoms. Low surface concentrations, as herein used, are about $10^{18}$ atoms/cc. or less.

One method which has been suggested in U.S. Patent 3,121,062 for reducing the vapor pressure of the impurity atoms in the doping atmosphere is the vaporization of a solid source wire composed of the doping element and a vaporizable metal which forms a semiconducting compound. The wire is fed into the doping chamber through a capillary tube and is evaporated at the mouth of the tube. This method, as disclosed, has a disadvantage in that it cannot be used with semiconductors such as silicon. Evaporation from the solid surface yields further disadvantages because high temperature vaporization is so fast that low concentrations cannot readily be obtained, and low temperature evaporation allows the solid surface to change composition by preferential evaporation of one of the components or by local inhomogeneities, thereby changing the concentration of dopant exposed to the atmosphere.

It has also been suggested that pure liquid or solid compounds of the doping element be used as impurity sources. Pure liquid sources are disadvantageous because systems utilizing them cannot be readily adjusted to reproducibly obtain ranges of surface concentrations which include low surface concentration diffused regions. The very low gas flow rates often required are extremely difficult to control accurately. The solid sources suffer the disadvantage that the active surface area is difficult to control because of local passivated areas occurring as a result of contaminants in the atmosphere or the solid.

The present invention provides a method and apparatus for overcoming the above mentioned difficulties of the prior art. The invention utilizes a liquid source composed of a nondoping constituent and a constituent including semiconductor impurity atoms. The liquid source is maintained at a relatively low temperature so that the vapor pressure of the constituent containing the impurity atoms is relatively low. A carrier gas is directed across the surface of the liquid and entrains the impurity atoms to form a doping atmosphere. The carrier gas is normally cooled to a temperature very close to that of the source before it is exposed to the source surface. After picking up the doping atoms, the atmosphere is conveyed from the liquid surface to the doping chamber where it is heated to the temperature at which doping is to occur. The apparatus of the invention comprises a mixture of a doping constituent and a nondoping constituent, means for directing a carrier gas across the surface of the mixture, and means for conveying the doped carrier gas to the semiconductor doping chamber.

Utilizing the present invention, the surface concentration obtainable to doped wafers can be accurately controlled by controlling the concentration of the doping constituent in the liquid mixture. The mixture has no rigid structure and so presents a surface which is easily changed and therefore is not greatly affected by preferential evaporation and inhomogeneities. The liquid source yields no change in surface concentration until sufficient preferential evaporation has occurred to noticeably change the composition of the bulk source liquid remaining. Judicious choice of the nonactive constituent allows the mixture to be maintained at a temperature below the normal melting point of the impurity containing constituent so that the vapor pressure of the impurity containing constituent may be as low as that normally found in solids without the difficulties attendant evaporation from a solid surface. Additionally, it has been discovered that the liquid source mixtures utilized in the present invention provide a surface concentration which is not strongly dependent upon the flow rate of the carrier gas. This advantage is substantial since gas flow rate is one of the most difficult variables to control in a diffusion system. The method and apparatus of the invention are particularly useful for achieving low surface concentration diffused layers but are generally useful over the entire doping range.

The invention will be more fully understood when taken in connection with the following detailed description and drawings wherein.

Figure 1:
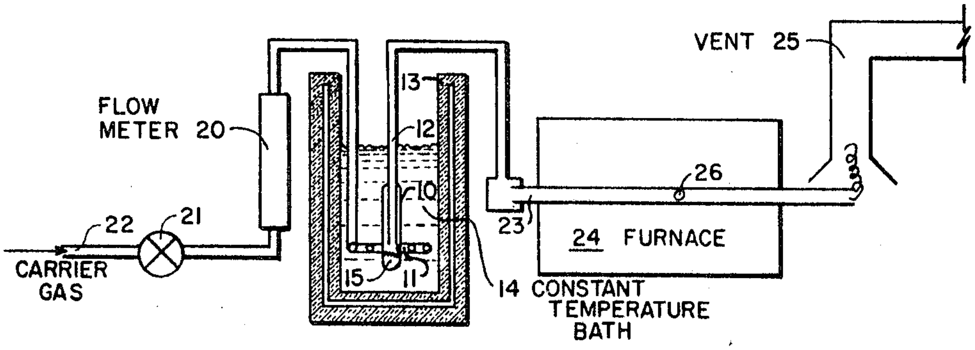
FIGURE 1 is a schematic partial cross sectional view of a diffusion system utilizing the method and apparatus of the invention.
Figure 2:
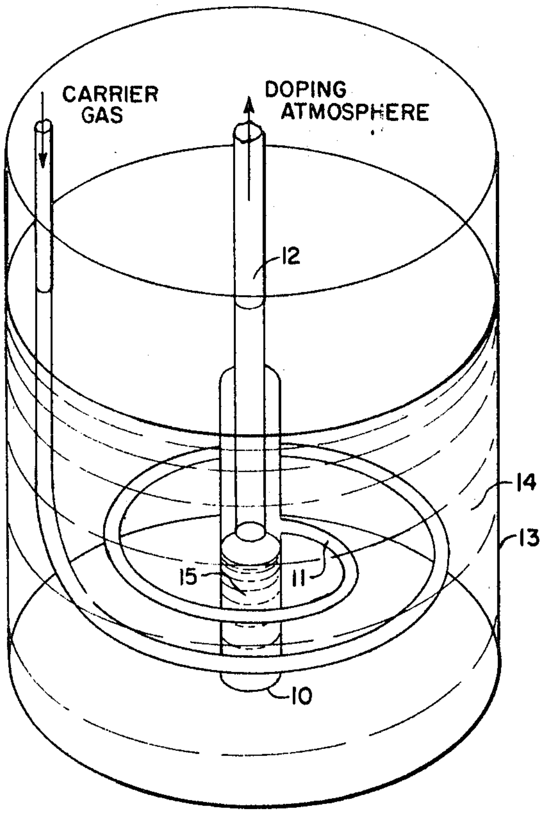
FIGURE 2 is a diagrammatic perspective view of the source container portion of the system of FIGURE 1.

FIGURE 1 discloses the system utilized in the invention, and FIGURE 2 discloses a more detailed view of the source vessel used. A source vessel or container 10, having inlet means 11 and outlet means 12, is suspended in a Dewar flask 13 which contains a constant temperature bath 14. The vessel 10 contains a liquid mixture 15 which comprises at least one non-doping constituent and at least one doping constituent including semiconductor impurity doping atoms. If desired, constituents may be chosen so that atoms of both impurity types are present at the same time. Thus, compensated doping can be carried out controllably. Outlet means 12 is preferably a tube which extends well into the interior of vessel 10. Inlet means 11 is preferably a spiral shape tube having a plurality of coils submersed in constant temperature bath 14 and entering vessel 10 in a fashion such that the carrier gas is directed across the liquid surface in a spiral fashion. The submersed coils of inlet means 11 are provided for cooling the carrier gas to approximately the temperature of the liquid mixture. The level of mixture 15 is preferably close to the mouth of outlet means 12.

Inlet means 11 is connected to a flow meter 20, which is in turn connected to a control valve means 21. Valve 21 is connected to a source of dry, purified carrier gas, not shown, by a flow tube 22. Outlet means 12 is connected to a diffusion tube 23 which is disposed within a diffusion furnace 24. Tube 23 is open to the atmosphere at the end opposite that connected to outlet means 12. The open end is vented to the outdoor through a vent 25. Disposed within tube 23 is a semiconductive wafer 26 to be doped.

In operation, a dried, purified carrier gas flows through tube 22 to valve 21 where its flow is regulated, and through flow meter 20 where its flow rate is monitored. From flow meter 20, the carrier gas flows through inlet means 11 where it is cooled to about the temperature of constant temperature bath 14. The cooled carrier gas is then directed across the surface of the liquid mixture 15 which has its temperature controlled by constant temperature bath 14. Since the temperature of the liquid mixture 15 is constant, the vapor pressure of the impurity containing compound in source vessel 10 will be controlled by the proportions of doping constituent and nondoping constituent in the mixture. As carrier gas flows across the surface of liquid 15, it entrains molecules of the doping compound present in the vapor above the liquid surface. After impurity atoms have been entrained in the gas flow, the resulting doping atmosphere leaves the source vessel through outlet means 12. The liquid source continuously replaces the molecules swept from the vapor above it.

The diameter of the tube through which the doping atmosphere flows is increased substantially at the connection of outlet means 12 and the diffusion tube 23. In one apparatus used, the diameters of these two tubes were ¼ in. for the outlet tube and 1½ in. for the diffusion tube. The doping atmosphere flow rate is therefore decreased substantially as it enters the diffusion tube. Diffusion furnace 24 preferably has an extended heating zone or two heating zones so that the gas entering the furnace may be heated from the temperature at which the impurity atoms were picked up to the temperature at which diffusion takes place before encountering the wafers to be diffused. As the doping atmosphere flows along diffusion tube 23, it is heated until the compound containing the doping atoms dissociates. The doping atmosphere flows past the semiconductive wafer 26 and out into vent 25 to the atmosphere. The wafer 26 is exposed to the doping atmosphere until an equilibrium condition is reached between the number of doping atoms being deposited upon its surface and the number of doping atoms evaporating from the surface.

Since the surface concentration in the diffused layers is ultimately controlled by the concentration of the constituents in the solution, it is necessary to maintain the proportions of the doping and nondoping constituents at a substantially constant value. This may be accomplished in any of several ways. First, the constituents themselves may be chosen so that preferential evaporation does not occur. That is, both constituents exist in the vapor state in exactly the same ratio as they exist in the liquid. Second, means may be provided for adding small amounts of the constituent which evaporates most rapidly from the solution to keep the concentration in solution nearly constant. Thirdly, the source vessel may be constructed so that the source mixture has a high volume to exposed surface ratio and preferential evaporation will not appreciably affect the total concentrations of the constituents in the solution for a substantial amount of time. The rate at which the concentrations of the constituents in the liquid change may also be controlled by the temperature at which the mixture is kept. If the liquid is kept at a sufficiently low temperature, the vapor pressures of the constituents will be so low that the source will exhibit very little change in volume over a long period of time.

Particular examples follow which illustrate use of the invention in forming both P and N type diffused layers in silicon.

Example I

Purified nitrogen carrier gas was allowed to flow at one cubic foot per hour through source vessel spiral 11 where it was cooled to about the temperature of a Dry Ice and methanol bath. The bath temperature was $-80°$ C.$\pm 1.5°$ C. The cooled nitrogen then flowed over the surface of a liquid solution trimethylborate and methanol which was kept at the bath temperature. Having been saturated with vapor, the nitrogen left the vessel and entered the cool end of a two zone furnace, giving it ample time to heat up before contact with the sample. The sample used was an N type silicon wafer having a five ohm-centimeter resistivity. Diffusion was carried out using a constant source method at 1050° C. Best results were obtained after the carrier gas had been allowed to flow over the source surface for at least 24 hours to achieve a stable condition. The wafer was exposed to the boron doped atmosphere for two hours to obtain 0.1 mil diffused P type layers.

Figure 3:
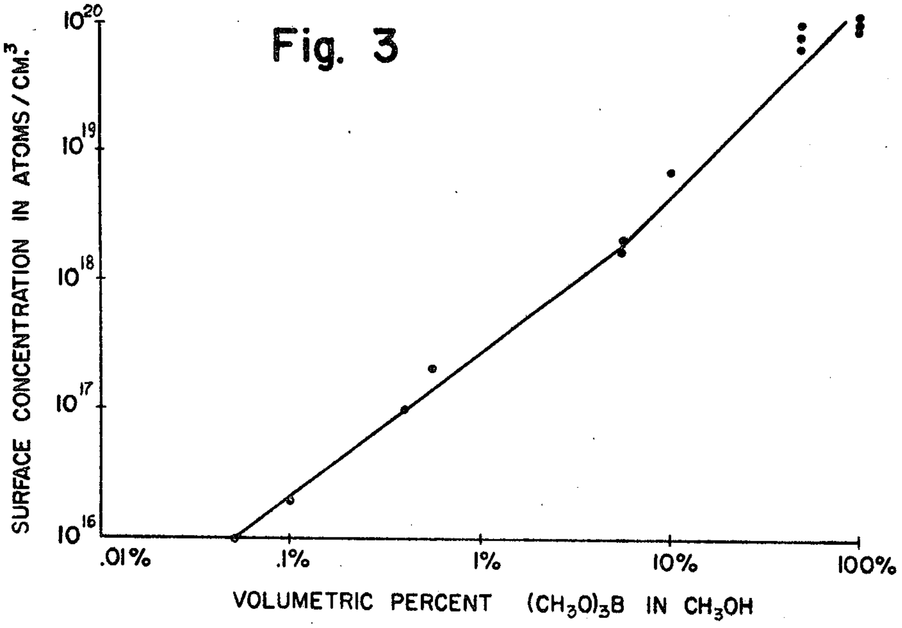
FIGURE 3 is a graphical representation of experimental results obtained utilizing a mixture of trimethylborate and methanol as the source liquid in the system of FIGURE 1.
Figure 4:
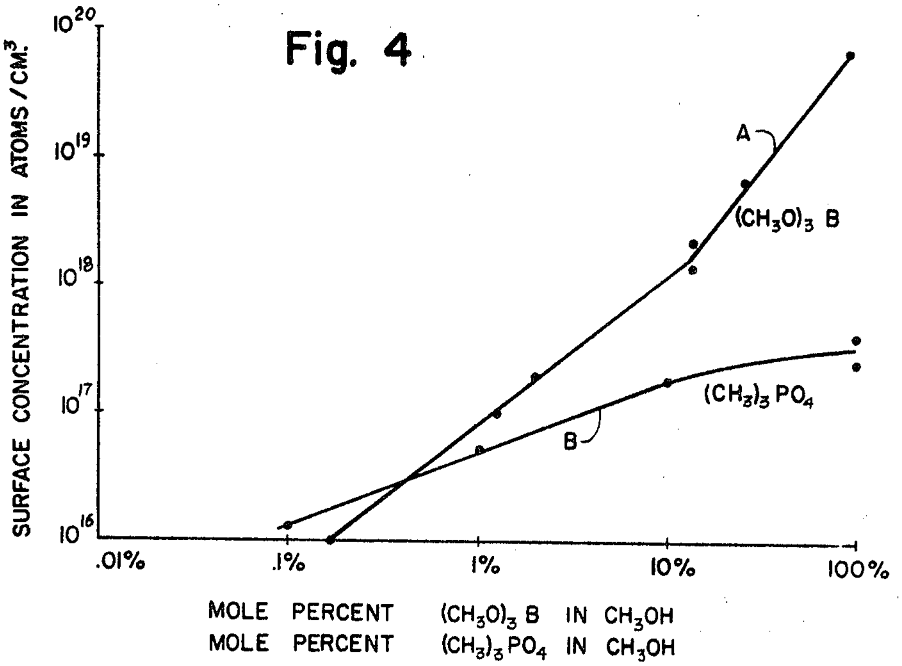
FIGURE 4 is a graphical representation of experimental results obtained utilizing mixtures of trimethylborate and methanol and of trimethylphosphate and methanol in the system of FIGURE 1.

FIGURE 3 is a plot of the surface concentration in atom/cc. as a function of the volumetric percentage of trimethylborate in solution with methanol. Several of the points on the graph represent identically measured values on several experimental runs. Experimental results have shown that fluctuations in flow rate from 1 to 8 liters/minute had no measurable effect on the surface concentration. It should be noted that the results shown in FIGURE 3 were highly reproducible at concentrations from $10^{17}$ atoms/cc. to $10^{16}$ atoms/cc. FIGURE 4 is a graphical representation of the surface concentration in atoms/cc. as a function of the mole percent of the doping constituent in the mixture. Curve A shows the relation between surface concentration and mole percent of trimethylborate in solution with methanol.

Example II

Nitrogen was used as the carrier gas in a process producing N type diffused layers in silicon. Trimethylphosphate and methanol provided the constituents of the source mixture. The mixture was maintained at $$-80°\text{C.}\pm 1.5°\text{ C.}$$

by a Dry Ice-methanol constant temperature bath. The nitrogen flow rate was controlled at 1 cubic ft./hour. The doping atmosphere was heated to 1050° C. where diffusions were carried out using a constant source method. Best results were obtained after the carrier gas had been allowed to flow over the source surface for at least 24 hours to achieve a stable condition. 0.1 mil layers of diffused N type regions were obtained by diffusing into 5 ohm-centimeter P type silicon wafers in the doping atmosphere for two hours. Curve B in FIGURE 4 graphically represents the surface concentration of the diffused layers as a function of the mole percent of trimethylphosphate in solution with methanol.

It will be readily apparent to those skilled in the art that many modifications may be made within the scope of the invention. For example, the geometry of the source vessel may be altered substantially without affecting the controllability by variations in concentration, but might require adjustment of the source temperature to make control effective at reasonable concentrations. The source temperature may also be varied within reasonable limits. Other combinations of sources and solvents can also be used; for example, triethylphosphate and methyl or ethyl alcohol.

I claim:

1. In a system for impurity doping of silicon, the combination comprising:
   a solution of methanol and a doping compound selected from the group consisting of trimethyl borate and trimethyl phosphate; and
   container means for maintaining the solution in liquid condition at a substantially constant −80° C., the container means including:
      means for cooling a stream of carrier gas to about −80° C.;
      means for directing the cooled carrier gas over the surface of the solution in a spiral pattern to form a doping atmosphere; and
      means for conveying the doping atmosphere to a doping chamber.

2. A method of providing a controlled concentration of doping impurity atoms in an atmosphere for use in doping semiconductors comprising the steps of:
   forming a solution of a methyl alcohol and trimethyl borate;

maintaining the solution in a liquid condition at a substantially constant predetermined temperature; and
   passing a carrier gas substantially at the predetermined temperature over a surface area of the liquid solution whereupon doping atoms in the atmosphere above the liquid are entrained by the carrier gas to form a doping atmosphere with a dopant concentration controlled by the proportions of solute and solvent in the solution.

References Cited

UNITED STATES PATENTS

| | | | |
|---|---|---|---|
| 3,337,379 | 8/1967 | Vogel | 148—189 |
| 3,082,126 | 3/1963 | Hung Chi Chang | 148—189 |
| 3,360,408 | 12/1967 | Wartenberg | 148—189 |

TOBIAS E. LEVOW, Primary Examiner

R. D. EDMONDS, Assistant Examiner

U.S. Cl. X.R.

148—174, 189